United States Patent
Sharon et al.

(10) Patent No.: US 8,516,351 B2
(45) Date of Patent: *Aug. 20, 2013

(54) COMPACT DECODING OF PUNCTURED BLOCK CODES

(75) Inventors: Eran Sharon, Rishon Lezion (IL); Idan Alrod, Herzliya (IL); Simon Litsyn, Giv'at Shmuel (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 989 days.

This patent is subject to a terminal disclaimer.

(21) Appl. No.: 12/506,316

(22) Filed: Jul. 21, 2009

(65) Prior Publication Data

US 2011/0022920 A1    Jan. 27, 2011

(51) Int. Cl.
*H03M 13/03*    (2006.01)

(52) U.S. Cl.
USPC ............ 714/790; 714/786; 714/755; 714/752

(58) Field of Classification Search
USPC .................................. 714/755, 786, 790, 752
See application file for complete search history.

(56) References Cited

U.S. PATENT DOCUMENTS

| | | | |
|---|---|---|---|
| 4,138,719 A | 2/1979 | Swanstrom et al. | |
| 4,568,488 A | 2/1986 | Lee-Huang | |
| 5,991,857 A | 11/1999 | Koetje et al. | |
| 6,304,991 B1 | 10/2001 | Rowitch et al. | |
| 6,637,000 B2 | 10/2003 | Rowitch et al. | |
| 6,678,263 B1 | 1/2004 | Hammons, Jr. et al. | |
| 6,715,121 B1 | 3/2004 | Laurent | |
| 6,718,508 B2 | 4/2004 | Lodge et al. | |
| 6,829,308 B2 | 12/2004 | Eroz et al. | |
| 6,871,303 B2 | 3/2005 | Halter | |
| 6,961,888 B2 | 11/2005 | Jin et al. | |
| 7,051,269 B1 | 5/2006 | Hindelang et al. | |
| 7,073,114 B2 | 7/2006 | Massey | |
| 7,127,659 B2 | 10/2006 | Richardson et al. | |
| 7,171,603 B2 | 1/2007 | Classon et al. | |
| 7,205,912 B1 | 4/2007 | Yang et al. | |
| 7,234,098 B2 | 6/2007 | Eroz et al. | |

(Continued)

FOREIGN PATENT DOCUMENTS

AU    2003 252889 A1    9/2003
AU    2003 266767 A1    12/2003

(Continued)

OTHER PUBLICATIONS

Song-Nam Hong et al :"Rate-compatible Puncturing for Finite-Length Low-Density Parity-Check Codes with Zigzag Parity Structure", Personal, Indoor and Mobile Radio Communications, 2006 IEEE 17th Inter National Symposium On, IEEE, PI Sep. 1, 2006, pp. 1-5.

(Continued)

*Primary Examiner* — Guy Lamarre
(74) *Attorney, Agent, or Firm* — Alston & Bird LLP

(57) ABSTRACT k input bits are encoded according to a code with which is associated a m×n=m+k parity check matrix H. The resulting codeword is punctured, with n'<n bits. The punctured codeword is exported to a corrupting medium such as a communication channel or a memory. A representation of the punctured codeword is imported from the corrupting medium and is decoded using a matrix H' that is smaller than H. For example, H has fewer than m'=m−(n−n') rows and fewer than n' columns.

16 Claims, 8 Drawing Sheets

(56) References Cited

U.S. PATENT DOCUMENTS

| | | |
|---|---|---|
| 7,263,651 B2 | 8/2007 | Xia et al. |
| 7,324,482 B2 | 1/2008 | Hammons, Jr. et al. |
| 7,333,546 B2 | 2/2008 | Kim et al. |
| 7,376,883 B2 | 5/2008 | Eroz et al. |
| 7,395,494 B2 | 7/2008 | Lee et al. |
| 7,483,496 B2 | 1/2009 | Eroz et al. |
| 7,502,983 B2 | 3/2009 | Massey |
| 7,523,377 B2 | 4/2009 | Halter |
| 7,526,717 B2 | 4/2009 | Kyung et al. |
| 7,600,173 B2 | 10/2009 | Matsumoto |
| 7,657,824 B2 | 2/2010 | Ha et al. |
| 7,702,986 B2 | 4/2010 | Bjerke et al. |
| 7,793,190 B1 | 9/2010 | Gray et al. |
| 7,802,164 B2 | 9/2010 | Hong et al. |
| 7,814,393 B2 | 10/2010 | Kyung et al. |
| 7,890,844 B2 | 2/2011 | Jeong et al. |
| 7,913,145 B2 | 3/2011 | Matsumoto |
| 7,930,622 B2 | 4/2011 | Oh et al. |
| 7,992,066 B2 | 8/2011 | Oh et al. |
| 8,020,062 B2 | 9/2011 | Jeong et al. |
| 8,130,228 B2 | 3/2012 | Horvath |
| 2002/0010892 A1 | 1/2002 | Lodge et al. |
| 2002/0032890 A1 | 3/2002 | Rowitch et al. |
| 2002/0046371 A1 | 4/2002 | Halter |
| 2003/0014709 A1 | 1/2003 | Miyoshi et al. |
| 2003/0095532 A1 | 5/2003 | Kim et al. |
| 2004/0025106 A1 | 2/2004 | Massey |
| 2004/0028002 A1 | 2/2004 | Eroz et al. |
| 2004/0146014 A1 | 7/2004 | Hammons, Jr. et al. |
| 2004/0153934 A1 | 8/2004 | Jin et al. |
| 2004/0268205 A1 | 12/2004 | Stolpman |
| 2005/0028065 A1 | 2/2005 | Halter |
| 2005/0063484 A1 | 3/2005 | Eroz et al. |
| 2005/0091565 A1 | 4/2005 | Eroz et al. |
| 2005/0091570 A1 | 4/2005 | Eroz et al. |
| 2005/0147593 A1 | 7/2005 | Kinch |
| 2005/0149840 A1 | 7/2005 | Lee et al. |
| 2005/0149845 A1 | 7/2005 | Shin et al. |
| 2005/0154958 A1 | 7/2005 | Xia et al. |
| 2005/0246611 A1 | 11/2005 | Jin et al. |
| 2005/0246616 A1 | 11/2005 | Choi et al. |
| 2005/0251730 A1 | 11/2005 | Classon et al. |
| 2005/0268202 A1* | 12/2005 | Molisch et al. ............... 714/752 |
| 2005/0283709 A1 | 12/2005 | Kyung et al. |
| 2005/0289437 A1 | 12/2005 | Oh et al. |
| 2005/0289438 A1 | 12/2005 | Massey |
| 2006/0093608 A1 | 5/2006 | Kinch |
| 2006/0123277 A1 | 6/2006 | Hocevar |
| 2006/0156181 A1 | 7/2006 | Ha et al. |
| 2006/0190801 A1 | 8/2006 | Shin et al. |
| 2006/0206781 A1 | 9/2006 | Choi et al. |
| 2006/0233281 A1 | 10/2006 | Chen et al. |
| 2007/0011567 A1 | 1/2007 | Choi et al. |
| 2007/0096950 A1 | 5/2007 | Yang et al. |
| 2007/0113148 A1 | 5/2007 | Hong et al. |
| 2007/0202889 A1 | 8/2007 | Kim et al. |
| 2007/0226578 A1 | 9/2007 | Eroz et al. |
| 2008/0008270 A1 | 1/2008 | Li et al. |
| 2008/0028274 A1 | 1/2008 | Lin |
| 2008/0059862 A1* | 3/2008 | Kyung et al. ............... 714/752 |
| 2008/0065972 A1 | 3/2008 | Eroz et al. |
| 2008/0089931 A1 | 4/2008 | Kinch |
| 2008/0126908 A1 | 5/2008 | Lin |
| 2008/0184084 A1 | 7/2008 | Matsumoto |
| 2008/0204286 A1 | 8/2008 | Kose |
| 2008/0222486 A1 | 9/2008 | Richardson et al. |
| 2008/0279270 A1 | 11/2008 | Zeng |
| 2008/0294960 A1 | 11/2008 | Sharon et al. |
| 2008/0320353 A1 | 12/2008 | Blankenship et al. |
| 2009/0006906 A1 | 1/2009 | Jacobsen et al. |
| 2009/0070652 A1 | 3/2009 | Myung et al. |
| 2009/0292966 A1* | 11/2009 | Liva et al. ............... 714/752 |
| 2010/0077275 A1 | 3/2010 | Yu et al. |
| 2010/0185914 A1 | 7/2010 | Tan et al. |
| 2011/0022921 A1 | 1/2011 | Sharon et al. |
| 2011/0022922 A1 | 1/2011 | Sharon et al. |
| 2011/0022927 A1 | 1/2011 | Sharon et al. |
| 2011/0113300 A1 | 5/2011 | Murakami et al. |

FOREIGN PATENT DOCUMENTS

| | | |
|---|---|---|
| EP | 1 231 735 A2 | 8/2002 |
| EP | 1 528 686 A1 | 5/2005 |
| EP | 2256935 | 12/2010 |
| WO | WO 00/09220 A1 | 2/2000 |
| WO | WO 00/18056 A1 | 3/2000 |
| WO | WO 00/35103 A1 | 6/2000 |
| WO | WO 02/15409 A1 | 2/2002 |
| WO | WO 02/32016 A1 | 4/2002 |
| WO | WO 02 063778 A1 | 8/2002 |
| WO | WO 02/065647 A1 | 8/2002 |
| WO | WO 02/067434 A1 | 8/2002 |
| WO | WO 02/069506 A2 | 9/2002 |
| WO | WO 02/091590 A1 | 11/2002 |
| WO | WO 03/099313 A1 | 12/2003 |
| WO | WO 2004/019268 A1 | 3/2004 |
| WO | WO 2005/015748 A1 | 2/2005 |
| WO | WO 2005/055948 A2 | 6/2005 |
| WO | WO 2005/112271 A2 | 11/2005 |
| WO | WO 2006/016261 A1 | 2/2006 |
| WO | WO 2007/085653 A1 | 8/2007 |
| WO | WO 2008/112625 A1 | 9/2008 |
| WO | WO 2008/157523 A2 | 12/2008 |
| WO | WO 2009/005732 A1 | 1/2009 |
| WO | WO 2009/041979 A1 | 4/2009 |

OTHER PUBLICATIONS

Song-Nam Hong et al "Optimal Puncturing of block—Type LDPC Codes and Their Fast Convergence Decoding" Information Theory, 2006 IEEE International Symposium On, IEEE, PI, Jul. 1, 2006, pp. 826-830.

Jung-Ae Kim et al: "Analysis of Check-Node Merging Decoding for Punctured LDPC Codes with Dual-Diagonal Parity Structure" IEEE Wireless Communications and Networking Conference, 2007, WCNC 2007, Mar. 15, 2011, Hong Kong, IEEE, Operations Canter, Piscataway, NJ, Mar. 1, 2007, pp. 572-576.

Joao Ascenso et al :"Design and Performance of a novel Low-density parity-check code for distributed video coding" Image Processing, 2008, ICIP 2008, 15th IEEE International Conference, IEEE, Piscatvvay, NJ, USA, Oct. 12, 2008, pp. 1116-1119.

Zaheer S F et al :"Improved regular and semi-random rate-compatible low-density parity-check codes with short block lengths" IET Communications, vol. 2. No. 7, Aug. 1, 2008, pp. 960-971.

Cain, Jr., J.B., et al.; "Punctured convolutional codes of rate ( n-1/n) and simplified maximum likelihood decoding"; IEEE Trans. Inform. Theory; vol. IT-25; pp. 97-100, 1979.

Ha, J., etal.; "Rate-compatible puncturing of low-density parity-check codes"; IEEE Transactions on Information Theory; vol. 50; Issue 11; Nov. 2004; pp. 2824-2836.

Hagenauer, J.; "Rate-compatible punctured convolutional codes (RCPC codes) and their applications"; IEEE Trans. Commun.; vol. 36; Apr. 1988; pp. 389-400.

Lugand, L.R., et al.; "Parity retransmission hybrid ARQ using rate ½ convolutional codes on a non-stationary channel", IEEE Trans. Commun.; vol. 37; Jul. 1989; pp. 755-765.

Mandelbaum, D.M.; "An adaptive feed-back coding using incremental redundancy"; IEEE; Trans. Inform. Theory; vol. IT-20; May 1974; pp. 388-389.

International Search Report and Written Opinion for International Application No. PCT/IB2010/053317, mailed Sep. 7, 2011.

Office action for U.S. Appl. No. 12/553,117, mailed May 29, 2012.
Office action for U.S. Appl. No. 12/506,342, mailed Apr. 26, 2012.
Office action for U.S. Appl. No. 12/506,327, mailed Jun. 7, 2012.

* cited by examiner

COMPACT DECODING OF PUNCTURED BLOCK CODES

FIELD AND BACKGROUND OF THE INVENTION

The present invention relates to punctured codes and, more particularly, to methods and devices for efficient decoding of punctured codewords.

A common conventional error control strategy, on time-varying channels, is to adapt the rate according to available channel state information (CSI), which is called rate adaptability. An effective way to realize this coding strategy is to use a single code and to puncture the code in a rate-compatible fashion, a so-called rate-compatible punctured code (RCPC). In such an approach, the transmitter systematically punctures parity bits in a codeword, and the locations of the punctured symbols are known to the receiver/receivers. Since the decoder for the lowest rate (the base code) is compatible with the decoders for the other higher rates, RCPC needs no additional complexity for the rate adaptability. Moreover, RCPC permits one to transmit redundancies progressively in conjunction with automatic repeat request (ARQ)

Consider a linear block code defined by a generator matrix $\Gamma$. To encode an information vector b, $\Gamma$ is right-multiplied by b to produce a codeword vector c:

$$c = b\Gamma \quad (1)$$

Associated with $\Gamma$ are one or more parity check matrices H that satisfy the matrix equation $$Hc = 0 \quad (2)$$

for all the codeword vectors c of the code, i.e. a vector c belongs to the code if the vector satisfies equation (2). Typically, $\Gamma$, H and c are defined over the field GF(2), i.e. the elements of $\Gamma$, H and c are 0 or 1, and the addition of field elements is done as integer addition modulo 2.

In many cases, such as when Rate-Compatible Punctured. Codes (RCPC) are being implemented, only a portion of the bits of the codeword c are transmitted over the channel, (in a communications scenario), or stored in a memory device, (storage applications). The locations of the transmitted bits are assumed to be known to both the transmitter and receiver, (of the communication system or storage device). Denote the transmitted or stored bits by c' and refer to c' as a sub-codeword. c' also is referred to herein as a "punctured codeword". The bits of c that are excluded from c' are referred to herein as "punctured bits". The bits received by the communications receiver, (or read by the memory reading device), typically are a noisy version of c' that is referred to herein as a "representation" of c', but by reuse of notation the received sub-codeword will still be denoted by c'.

The conventional method for decoding of c, given the representation of the sub-codeword c', is by treating the punctured bits of c as "erasures": during decoding, bits are inserted into c' to bring the number of bits of c' back up to the full number of bits of c, and then decoding is performed by decoding the code of the original matrix equation (2) while assigning special values ("erasures") to the inserted bits. This procedure for decoding punctured codewords is referred to herein as "erasure decoding".

To provide a concrete example of erasure decoding, Low-Density Parity Check (LDPC) codes now will be described.

A LDPC code is a linear binary block code whose parity-check matrix or matrices H is/are sparse. As shown in FIG. 1, a LDPC parity check matrix H is equivalent to a sparse bipartite "Tanner graph" G=(V,C,E) with a set V of N bit nodes (N=13 in FIG. 1), a set C of M check nodes (M=10 in FIG. 1) and a set E of edges (E=38 in FIG. 1) connecting bit nodes to check nodes. The bit nodes correspond to the codeword bits and the check nodes correspond to parity-check constraints on the bits. A bit node is connected by edges to the check nodes that the bit node participates with. In the matrix representation (matrix H of equation (2)) of the code on the left side of FIG. 1 an edge connecting bit node i with check node j is depicted by a non-zero matrix element at the intersection of row j and column i.

Next to the first and last check nodes of FIG. 1 are shown the equivalent rows of equation (1). The symbol "$\oplus$" means "XOR".

LDPC codes can be decoded using iterative message passing decoding algorithms. These algorithms operate by exchanging messages between bit nodes and check nodes along the edges of the underlying bipartite graph that represents the code. The decoder is provided with initial estimates of the codeword bits (based on the communication channel output or based on the read memory content). These initial estimates are refined and improved by imposing the parity-check constraints that the bits should satisfy as a valid codeword (according to equation (2)). This is done by exchanging information between the bit nodes representing the codeword bits and the check nodes representing parity-check constraints on the codeword bits, using the messages that are passed along the graph edges.

In iterative decoding algorithms, it is common to utilize "soft" bit estimations, which convey both the bit estimations and the reliabilities of the bit estimations.

The bit estimations conveyed by the messages passed along the graph edges can be expressed in various forms. A common measure for expressing a "soft" estimation of a bit v is as a Log-Likelihood Ratio (LLR)

$$\log \frac{Pr(v = 0 \mid \text{current constraints and observations})}{Pr(v = 1 \mid \text{current constraints and observations})},$$

where the "current constraints and observations" are the various parity-check constraints taken into account in computing the message at hand and observations, such as the sequence of symbols received from a communication channel, corresponding to the bits participating in these parity checks. The sign of the LLR provides the bit estimation (i.e., positive LLR corresponds to v=0 and negative LLR corresponds to v=1). The magnitude of the LLR provides the reliability of the estimation (i.e., |LLR|=0 means that the estimation is completely unreliable and |LLR|=±∞ means that the estimation is completely reliable and the bit value is known).

Returning now to the discussion of decoding a punctured codeword by "erasure decoding", if H is the parity-check matrix of an LDPC code, then the decoding is performed according to the Tanner graph associated with H, while assigning LLR=0 as an initial LLR to all the bits of the codeword c which are not bits of the sub-codeword c' (i.e., to all the punctured bits of c).

Such erasure decoding may also be applied to other types of codes such as BCH codes.

In general, "erasure decoding" is more complex, and converges slower than, ordinary decoding. Moreover, typically the code is a systematic code, that encodes the input data bits as the codeword c by appending redundancy bits to the data bits, and the punctured bits are selected from among the redundancy bits, thus there is no real need to decode the punctured bits. A method that directly decodes the sub-codeword c' and extracts the information bits, (which are typically the same as the information bits of c), would be of a significant benefit.

DEFINITIONS

The methodology described herein is applicable to encoding and decoding punctured codewords in at least two different circumstances. One circumstance is the storing of data in a storage medium, followed by the retrieving of the data from the storage medium. The other circumstance is the transmitting of data to a transmission medium, followed by the receiving of the data from the transmission medium. Therefore, the concepts of "storing" and "transmitting" of data are generalized herein to the concept of "exporting" data, and the concepts of "retrieving" and "receiving" data are generalized herein to the concept of "importing" data. Both "storing" data d "transmitting" data thus are special cases of "exporting" data, and both "retrieving" data and "receiving" data are special cases of "importing" data. The process of "exporting" data and then optionally "importing" the data is termed herein "porting" data.

The usual instantiation of a storage medium is as a memory. The usual instantiation of a transmission medium is as a communication channel. Both the storage medium and the transmission medium are examples of "corrupting" media. A "corrupting" medium is a medium that may introduce errors to data that are exported to the medium, so that the corresponding imported data may not be identical to the exported data.

"Encoding" is understood herein to mean turning an information vector ("b" in equation (1)) into a codeword ("c" in equation (1)). "Decoding" is understood herein to mean turning a representation of a codeword into the originally encoded information vector. It is a "representation" of the codeword, as imported from a corrupting medium, that is decoded, and not the codeword itself, because what is imported may be corrupted by noise relative to what is exported. Strictly speaking, the matrix H, or the equivalent Tanner graph as used in decoding by message passing, is used only to reconstruct the original codeword, not to provide the original information vector, but given the original codeword, it is well-known in the art how to recover the original information vector. Indeed, in the case of a systematic code, it is trivial to recover the original information vector because the codeword is just a concatenation of the original information vector and parity bits. In the appended claims, it is to be understood that using a matrix to decode a representation of a codeword means using the matrix to the extent that the matrix can be used to decode the representation of the codeword.

SUMMARY OF THE INVENTION

Another embodiment provided herein is a method of porting k input bits, including: (a) encoding the input bits according to a first code with which is associated a parity check matrix H that has m rows and $n=m+k$ columns, thereby producing a codeword of n bits; (b) puncturing the codeword, thereby providing a punctured codeword of $n'<n$ bits; (c) exporting the punctured codeword to a corrupting medium; (d) importing a representation of the punctured codeword from the corrupting medium; and (e) decoding the representation of the punctured codeword using a matrix H' that has fewer than $m'=m-(n-n')$ rows and fewer than n' columns.

Another embodiment provided herein is a memory device including: (a) a memory, and (b) a controller for storing k input bits in the memory and for recovering the input bits from the memory, the controller including: (i) an encoder for: (A) encoding the input bits according to a code with which is associated a parity check matrix H that has m rows and $n=m+k$ columns, thereby producing a codeword of n bits, (B) puncturing the codeword, thereby providing a punctured codeword of fewer than n bits, and (ii) a decoder for decoding a representation of the punctured codeword that has been read from the memory, the decoding being effected using a matrix H' that has fewer than $m'm=m-(n-n')$ rows and fewer than n' columns.

Another embodiment provided herein is a system including: (a) a first memory; and (b) a host of the first memory including: (i) a second memory having stored therein code for managing the first memory by steps including: (A) encoding k input bits according to a code with which is associated a parity check matrix H that has m rows and $n=m+k$ columns, thereby producing a codeword of n bits, (B) puncturing the codeword, thereby providing a punctured codeword of $n'<n$ bits, (C) storing the punctured codeword in the first memory, (D) reading a representation of the punctured codeword from the first memory, and (E) decoding the representation of the punctured codeword using a matrix H' that has fewer than $m'=m-(n-n')$ rows and fewer than n' columns, and (ii) a processor for executing the code.

Another embodiment provided herein is a computer-readable storage medium having embodied thereon computer-readable code for managing a memory, the computer-readable code including: (a) program code for encoding k input bits according to a code with which is associated a parity check matrix H that has in rows and $n=m+k$ columns, thereby producing a codeword of n bits; (b) program code for puncturing the codeword, thereby providing a punctured codeword of $n'<n$ bits; (c) program code for storing the punctured codeword in a memory; (d) program code for reading a representation of the punctured codeword from the memory; and (e) program code for decoding the representation of the punctured codeword using a matrix H' that has fewer than $m'=m-(n-n')$ rows and fewer than n' columns.

Another embodiment provided herein is a communication system including: (a) a transmitter including: (i) an encoder for: (A) encoding k input bits according to a code with which is associated a parity check matrix H that has m rows and $n=m+k$ columns, thereby producing a codeword of n bits, and (B) puncturing the codeword, thereby providing a punctured codeword of fewer than n bits, and (ii) a modulator for transmitting the punctured codeword via a communication channel as a modulated signal; and (b) a receiver including: (i) a demodulator for receiving the modulated signal from the communication channel and for demodulating the modulated signal, thereby providing a representation of the punctured codeword, and (ii) a decoder for decoding the representation of the punctured codeword using a matrix H' that has fewer than $m'=m-(n-n')$ rows and fewer than n' columns.

Another embodiment provided herein is a method of recovering k input bits that have been encoded as a codeword of n bits according to a first code with which is associated a parity check matrix H that has m rows and $n=m+k$ columns and that have been exported to a corrupting medium as a punctured codeword produced by eliminating $n-n'$ selected bits from the codeword, the method including: (a) importing a representation of the punctured codeword from the corrupting medium; and (b) decoding the representation of the punctured codeword using a matrix H' that has fewer than $m'=m-(n-n')$ rows and fewer than n' columns.

Another embodiment provided herein is a decoder for decoding a representation of a punctured codeword, the punctured codeword having been produced by eliminating $n-n'$ selected bits from a codeword of n bits, the codeword having been produced by encoding k input bits according to a code with which is associated a parity check matrix H that has m rows and n=m+k columns, the decoder including: (a) a decoding module for decoding the representation of the punctured codeword using a matrix H' that has fewer than m'=m−(n−n') rows and fewer than n' columns.

Another embodiment provided herein is a receiver including: (a) a demodulator for receiving a modulated signal from a communication channel and for demodulating the modulated signal to provide a representation of a punctured codeword that had been produced by eliminating n−n' selected bits from a codeword of n bits, the codeword having been produced by encoding k input bits according to a code with which is associated a parity check matrix H that has m rows and n=m+k columns; and (b) a decoding module for decoding the representation of the punctured codeword using a matrix H' that has fewer than m'=m−(n−n') rows and fewer than n' columns.

In the most general embodiment of a method for porting k input bits, the input bits are encoded according to a first code with which is associated a m×n parity check matrix H, where n=m+k. The encoding produces a codeword of n bits. The n-bit codeword is punctured, thereby providing a punctured codeword of n'<n bits. The punctured codeword is exported to a corrupting medium. A representation of the punctured codeword is imported from the corrupting medium. The representation of the punctured codeword is decoded using a matrix H' that is smaller than H: H' has fewer than m'=m−(n−n') rows and fewer than n' columns.

Preferably, the first code is a block code.

Preferably, H' is a parity check matrix of a second code and the punctured codeword is a codeword of the second code.

Preferably, the method includes the step of deriving H' from H. Most preferably, the puncturing of the codeword includes eliminating n−n' selected bits from the codeword, and the derivation of H' from H includes performing Gaussian elimination on H to set equal to zero the first m' elements of the columns of H that correspond to the bits of the codeword that are selected for elimination. H' then is selected rows of the resulting matrix without the zeroed-out columns and without the column(s) that correspond to (an)other bit(s) that is/are connected, by H, only to the selected bits.

Preferably, the decoding includes exchanging messages between the rows and columns of H', as in LDPC. As noted above, exchanging messages between the rows and columns of a parity check matrix is equivalent to exchanging messages between the bit nodes and the check nodes of a Tanner graph.

In some embodiments of the method, the corrupting medium is a transmission medium. The exporting of the punctured codeword includes transmitting the punctured codeword via the transmission medium. The importing of the representation of the punctured codeword includes receiving the representation of the punctured codeword from the transmission medium.

In other embodiments of the method, the corrupting medium is a storage medium. The exporting of the punctured codeword includes storing the punctured codeword in the storage medium. The importing of the representation of the punctured codeword includes reading the representation of the punctured codeword from the storage medium.

A memory device that uses the method for porting k input bits includes a memory and a controller. The controller stores the input bits in the memory and recovers the input bits from the memory. The controller includes an encoder and a decoder. The encoder encodes the input bits according to the matrix H and punctures the resulting codeword to provide a punctured codeword. The decoder uses the matrix H' to decode a representation of the punctured codeword that has been read from the memory.

A system that uses the method for porting k input bits includes a first memory and a host of the first memory. The host includes a second memory and a processor. The second memory has stored therein code for managing the first memory according to the method for porting k input bits as applied to a storage medium. The processor is for executing the code. The scope of the appended claims also includes a computer-readable storage medium having embodied thereon computer-readable code for managing such a first memory according to the method for porting k input bits.

A communication system that uses the method for porting k input bits includes a transmitter and a receiver. The transmitter includes an encoder and a modulator. The encoder encodes the input bits according to the matrix H and punctures the resulting codeword to provide a punctured codeword. The modulator transmits the punctured codeword via a communication channel as a modulated signal. The decoder includes a demodulator and a decoder. The demodulator receives the modulated signal from the communication channel and demodulates the modulated signal, thereby providing a representation of the punctured codeword. The decoder uses the matrix H' to decode the representation of the punctured codeword.

In the most general embodiment of a method for recovering k input bits that have been encoded as a codeword of n bits according to a first code with which is associated an m×n=m+k parity check matrix H and that have been exported to a corrupting medium as a punctured codeword produced by eliminating n−n' selected bits from the codeword, a representation of the punctured codeword is imported from the corrupting medium. The representation of the punctured codeword is decoded using a matrix H' that is smaller than H: H' has fewer than m'=m−(n−n') rows and fewer than n' columns.

Preferably, the first code is a block code.

Preferably, H' is a parity check matrix of a second code and the punctured codeword is a codeword of the second code.

Preferably, the method includes the step of deriving H' from H. Most preferably, the puncturing of the codeword includes eliminating n−n' selected bits from the codeword, and the derivation of H' from H includes performing Gaussian elimination on H to set equal to zero the first m' elements of the columns of H that correspond to the bits of the codeword that are selected for elimination. H' then is selected rows of the resulting matrix without the zeroed-out columns and without one or more columns that correspond(s) to (an)other bit(s) that is/are connected, by H, only to the selected bits.

Preferably, the decoding includes exchanging messages between the rows and columns of H', as in LDPC. As noted above, exchanging messages between the rows and columns of a parity check matrix is equivalent to exchanging messages between the bit nodes and the check nodes of a Tanner graph.

A decoder, for decoding a representation of a punctured codeword that was produced by eliminating n−n' selected bits from a n-bit codeword that was produced by encoding k input bits according to a code with which is associated a m×n=m+k parity check matrix H, includes a decoding module that decodes the representation of the punctured codeword using a matrix H' that is smaller than H: H' has fewer than m'=m−(n−n') rows and fewer than n' columns.

Preferably, the decoder also includes a code reduction module for deriving H' from H. Most preferably, the derivation of H' from H includes performing Gaussian elimination on H to set equal to zero the first m' elements of the columns of H that correspond to the bits of the codeword that are selected for elimination. H' then is selected rows of the resulting matrix without the zeroed-out columns and without one or more columns that correspond(s) to (an)other bit(s) that is/are connected, by H, only to the selected bits.

A receiver includes a demodulator and a decoding module. The demodulator receives a modulated signal from a communication channel and demodulates the modulated signal to provide a representation of a punctured codeword that had been produced by eliminating n−n' selected bits from a n-bit codeword that had been produced by encoding k input bits according to a code with which is associated a m×n=m+k parity check matrix H. The decoding module decodes the representation of the punctured codeword using a matrix H' that is smaller than H: H' has fewer than m'=m−(n−n') rows and fewer than n' columns.

Preferably, the receiver also includes a code reduction module for deriving H' from H. Most preferably, the derivation of H' from H includes performing Gaussian elimination on H to set equal to zero the first m' elements of the columns of H that correspond to the bits of the codeword that are selected for elimination. H' then is selected rows of the resulting matrix without the zeroed-out columns and without one or more columns that correspond(s) to (an)other bit(s) that is/are connected, by H, only to the selected bits.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

The principles and operation of efficient decoding of a punctured codeword may be better understood with reference to the drawings and the accompanying description.

Denote the order of H as m×n, i.e. H has m rows and n columns. H is a parity check matrix of a code C, which of course implies that c is of length n (i.e. c has n elements). A punctured codeword c' is derived from c by deleting some predefined coordinates of c. Denote the length of c' by n'. Of course, n'<n. The set of all punctured codewords is itself a code, denoted C'. Preferably, the information bits of the original code C are not punctured, so that the punctured code C' has the same size (i.e. the same number of codewords) as C, but has fewer redundancy bits.

Given H, c', n, m and n', a reduced matrix code H' is computed, such that if c is a codeword satisfying equation (2) then the punctured sub-codeword c' satisfies $$H'c'=0 \qquad (3)$$

A matrix H' constructed as described below is smaller (fewer rows and/or columns) than H, so that decoding of c' according to equation (3) is easier and less complex then applying erasure decoding to equation (2).

Given H of order m×n, and given c' of length n', a matrix H' of order m'×n' is computed, where m'=m−(n−n').

H' is computed by performing a Gaussian elimination algorithm on the matrix H, with the goal of achieving all O-s in a selected m' rows of H, for example in the first m' rows of H, in all the columns associated with the punctured bits of c. After achieving this goal, and denoting the modified matrix by H", the first m' rows of H" represent a reduced code, and the punctured bits do not participate in the code, since they are all multiplied by 0 in all the check equations.

Therefore the reduced code can be represented by taking only the first m' rows of H", and the n' columns of H" associated with non-punctured bits. H' is those first m' rows of H" without the columns of H" that are zeroed in the first m' rows of H" and that correspond to punctured bits. For example, if n=4096 and bits 4000, 4010, 4020, 4030 and 4040 of c are punctured (n' 4091), the columns of H" that are zeroed in the first m' rows of H" are columns 4000, 4010, 4020, 4030 and 4040, and H' is the first m' rows of H" without columns 4000, 4010, 4020, 4030 and 4040.

Figure 1:
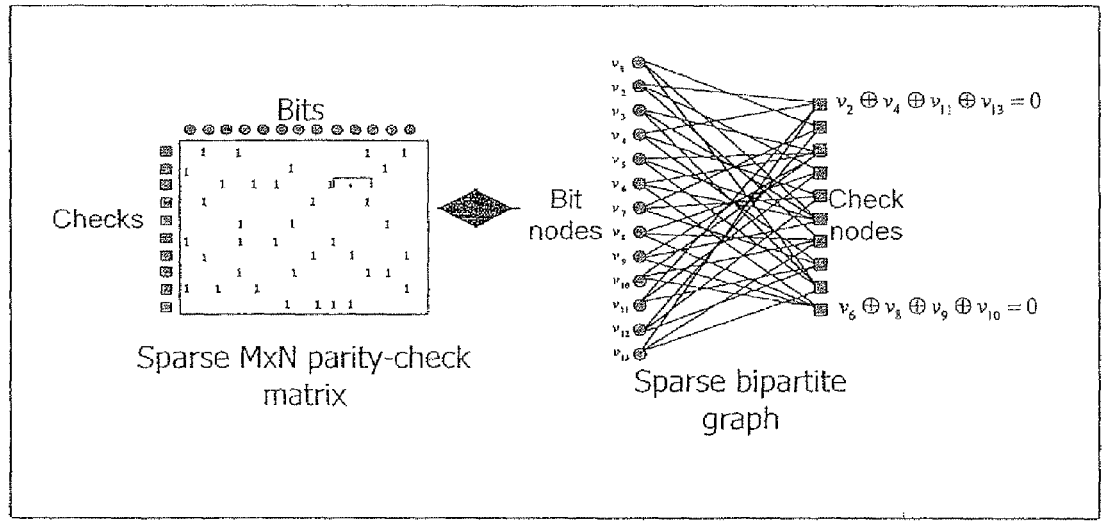
FIG. 1 shows how a LDPC code can be represented as either a sparse parity check matrix or as a Tanner graph.
Figure 2:
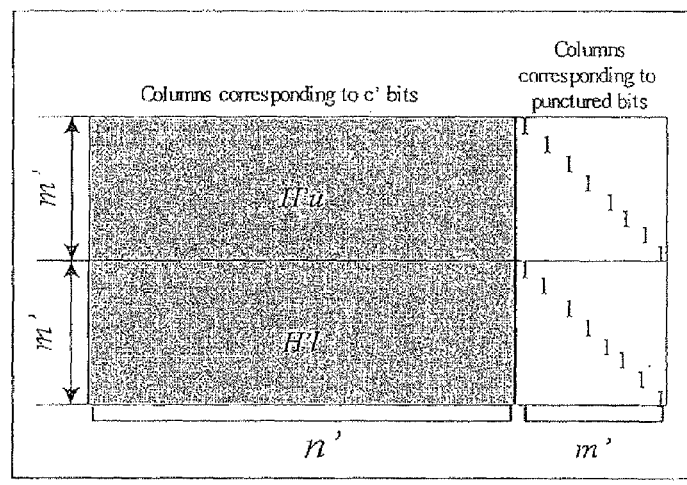
FIG. 2 illustrates the transformation of a parity check matrix H to a smaller matrix H' for decoding a punctured codeword.

For example consider a code whose parity check matrix H has the form shown in FIG. 2. In this case the submatrices related to the punctured bits in the lower part of the matrix and the upper part of the matrix have the same structure, therefore replacing the upper half of the matrix with the sum (modulo 2) of the upper and lower halves of the matrix generates a matrix H" with all O-s in the first m' rows of the columns associated with the punctured bits. Because only row operations are performed in order to generate H" from H, both H and H" span the same linear subspace and both H and H" are parity-check matrices of the code C. H' is derived from H" by eliminating all but the first m' rows of H" and the first n' columns of H", resulting in a (m−m')×n' parity-check matrix of the punctured code C'.

Moreover, in this example the matrix H' is derived with a minimal number of row operations applied to each row (in this case one operation per row). Hence, the number of 1's in each row of H' is at most twice the number of 1's in a row of H. If H is sparse then H' usually can be considered as sparse. Therefore, if the original code is an LDPC code, the reduced code H' usually can also be regarded as an LDPC code, thus it can be decoded efficiently, by generating the Tanner graph of the code and performing a message passing algorithm.

In most implementations, a limit is set on the number of row operations performed on H, in order to preserve certain properties, such as sparseness.

Figure 3:
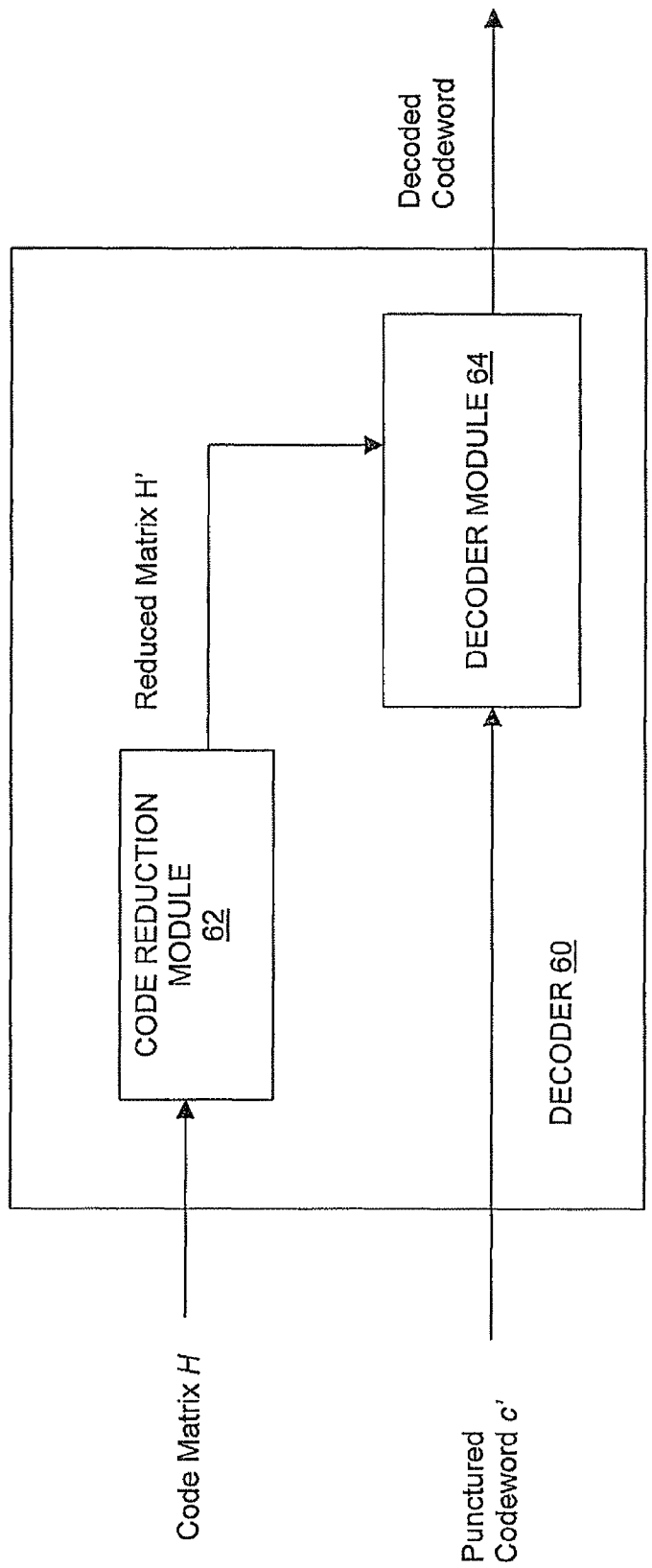
FIGS. 3 and 4 are simplified schematic high-level block diagrams of decoders for efficient decoding of representations of punctured codewords.

FIG. 3 is a simplified schematic high-level block diagram of a decoder 60 for implementing the efficient punctured decoding described above. Punctured decoder 60 includes a code reduction module 62 and a decoder module 64. The inputs to punctured decoder 60 are the code matrix H and the (possibly noisy and corrupted) representation of the sub-codeword c'. The reduced code matrix H' is computed in code reduction module 62 (preferably once, and then stored in a local volatile or nonvolatile memory (not shown)), and H' is then provided to decoder module 64, together with the representation of sub-codeword c'. The output of decoder module 64 is the decoded codeword, which includes the information content of the original sub-codeword c'. This information is equal to the information content of the original codeword c.

Figure 4:
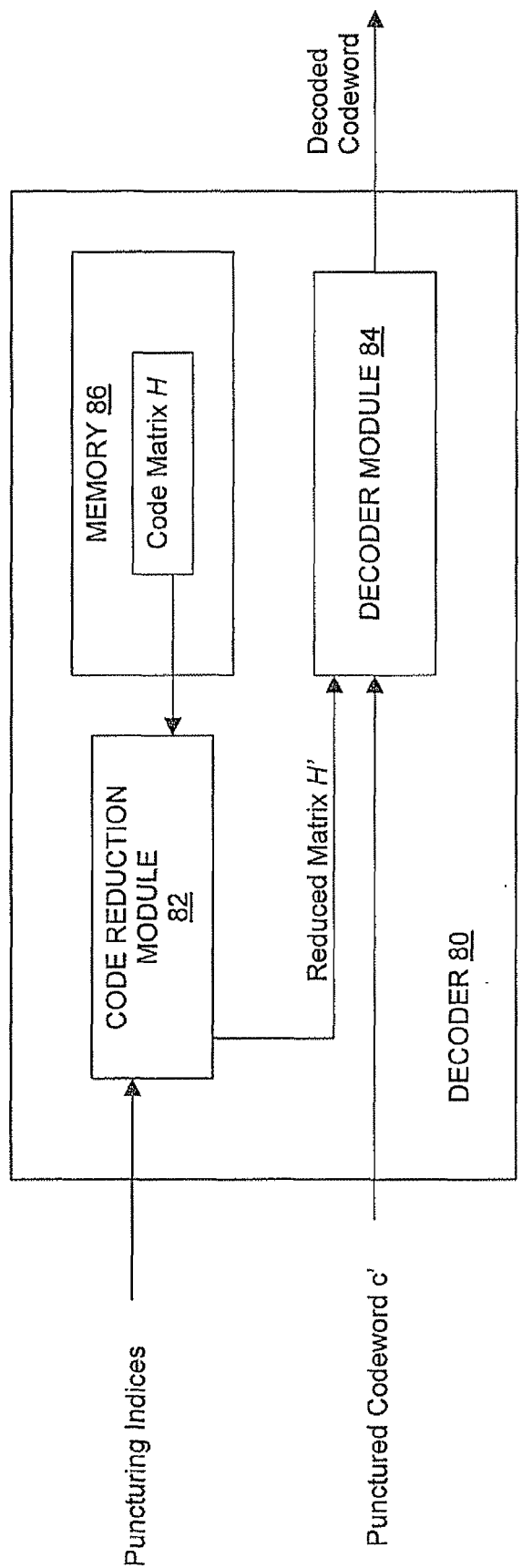

FIG. 4 is a simplified schematic high-level block diagram of another decoder 80 for implementing the efficient punctured decoding described above. In addition to a code reduction module 82 and a decoder module 84, decoder 80 includes a non-volatile memory 86 for storing the code matrix H. The inputs to decoder 80 are the (possibly noisy and corrupted) representation of the sub-codeword c' and information, such as the indices of the bits of c that were punctured to create c', that tells code reduction module 82 which columns of H to zero out in the first m' rows of H in order to create H". Code reduction module 82 computes H' as needed and preferably stores H' locally, either in memory 86 or in a local non-volatile memory (not shown). As in decoder 60, H' is provided to decoder module 84 together with the representation of sub-codeword c'. The output of decoder module 84 is the decoded codeword.

Code reduction modules 62 and 82 and decoder modules 64 and 84 may be implemented in hardware, in firmware, in software, or in combinations thereof, as is known in the art.

Figure 5:
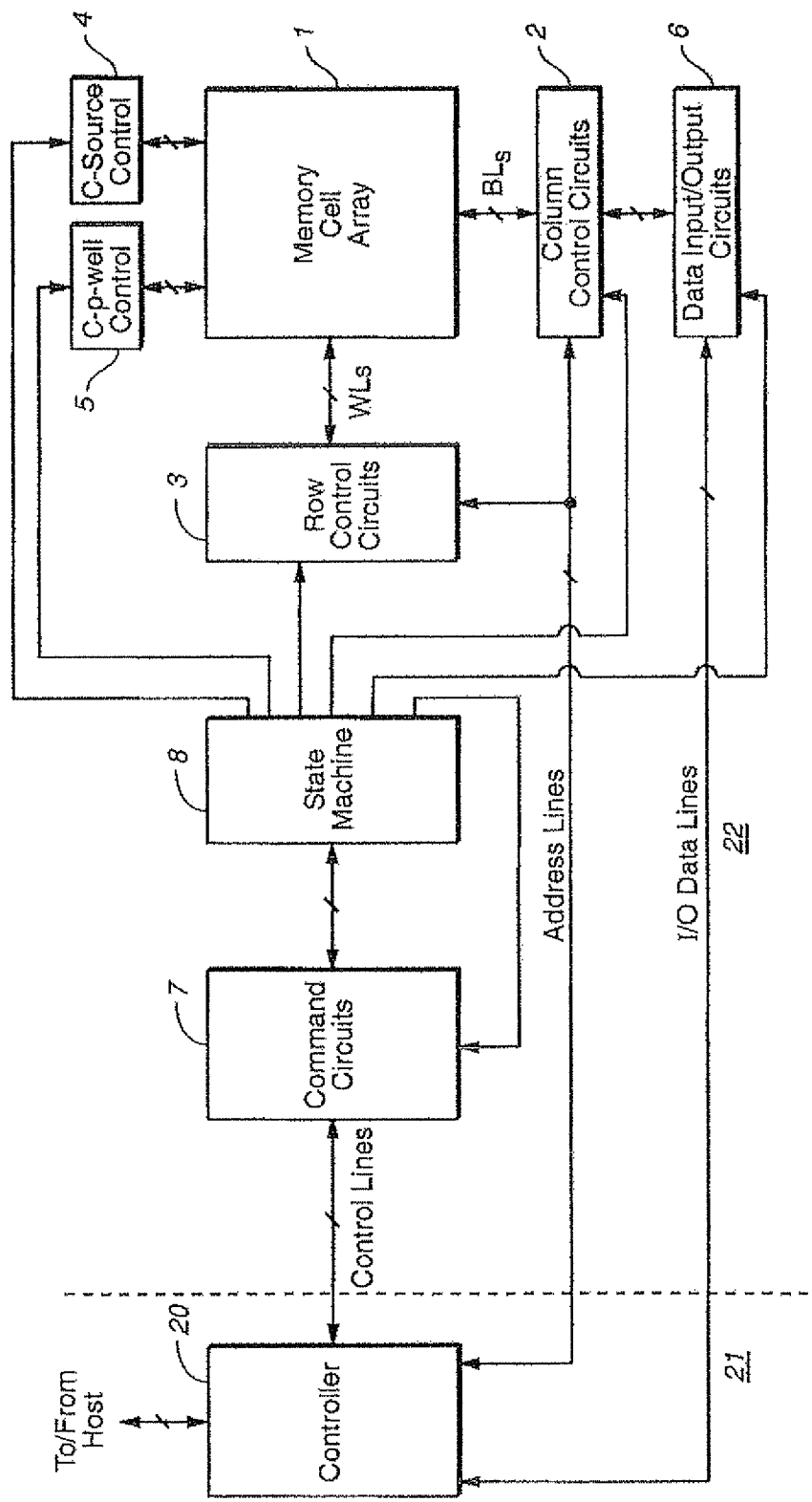
FIG. 5 is a high-level schematic block diagram of a flash memory device whose controller includes the decoder of FIG. 3 or the decoder of FIG. 4.

FIG. 5 is a high-level schematic block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contains a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 6:
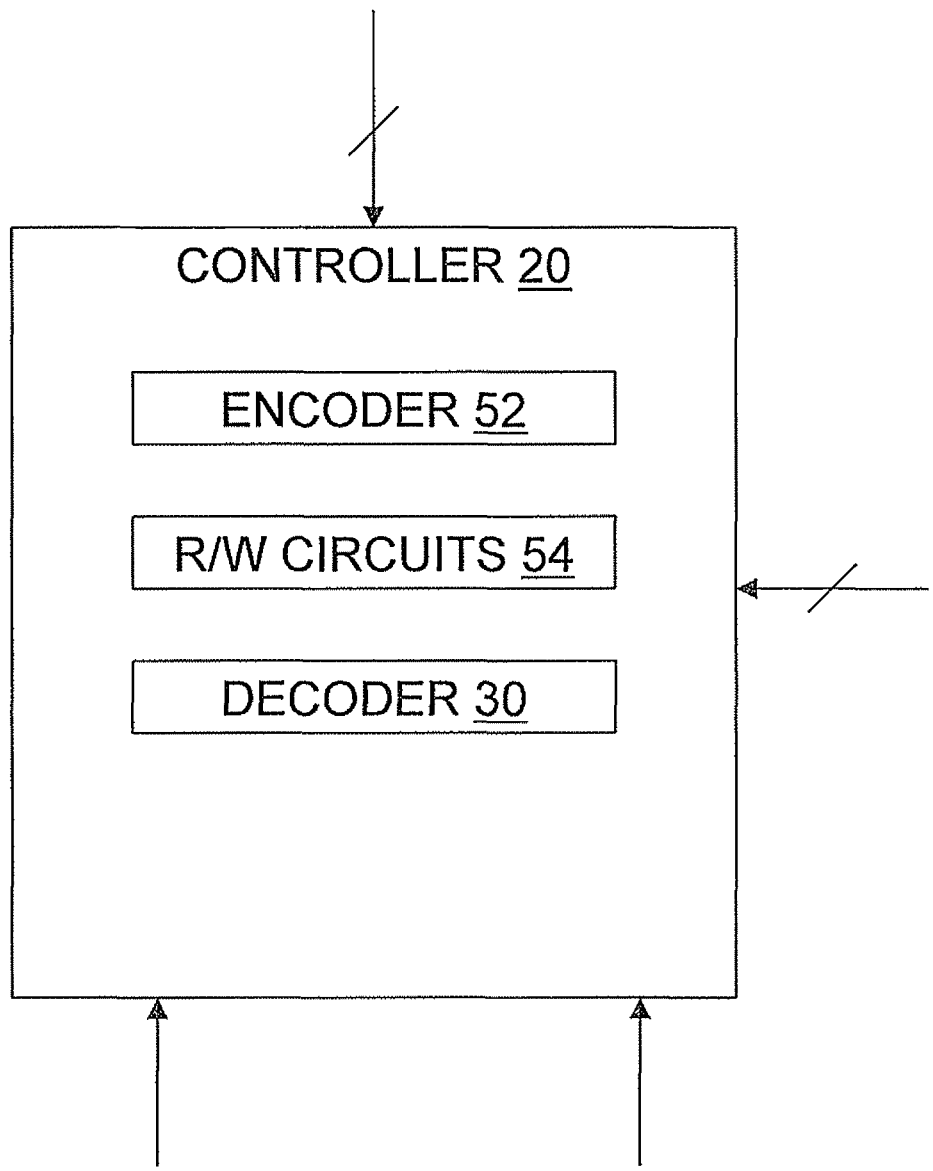
FIG. 6 is a detail of FIG. 5.

FIG. 6 is an enlarged view of part of FIG. 5, showing that controller 20 includes an encoder 52 for encoding user data received from the host as one or more punctured codewords, circuitry 54 for instructing command circuits 7 to store the punctured codewords in memory cell array 1 and for instructing command circuits 7 to retrieving the stored punctured codewords from memory cell array 1, and a decoder 30, that could be, for example, either decoder 60 of FIG. 3 or decoder 80 of FIG. 4, for decoding the representation of the punctured codewords as retrieved by circuitry 54.

RCPC conventionally is thought of as applicable only to time-varying communication channels. It is not commonly appreciated that memories such as flash memories, that become less and less reliable over time, also are time-varying corrupting media. Controller 20 initially uses a relatively large number of punctured bits, and gradually reduces that number as memory cell array 1 becomes less reliable over time.

Figure 7:
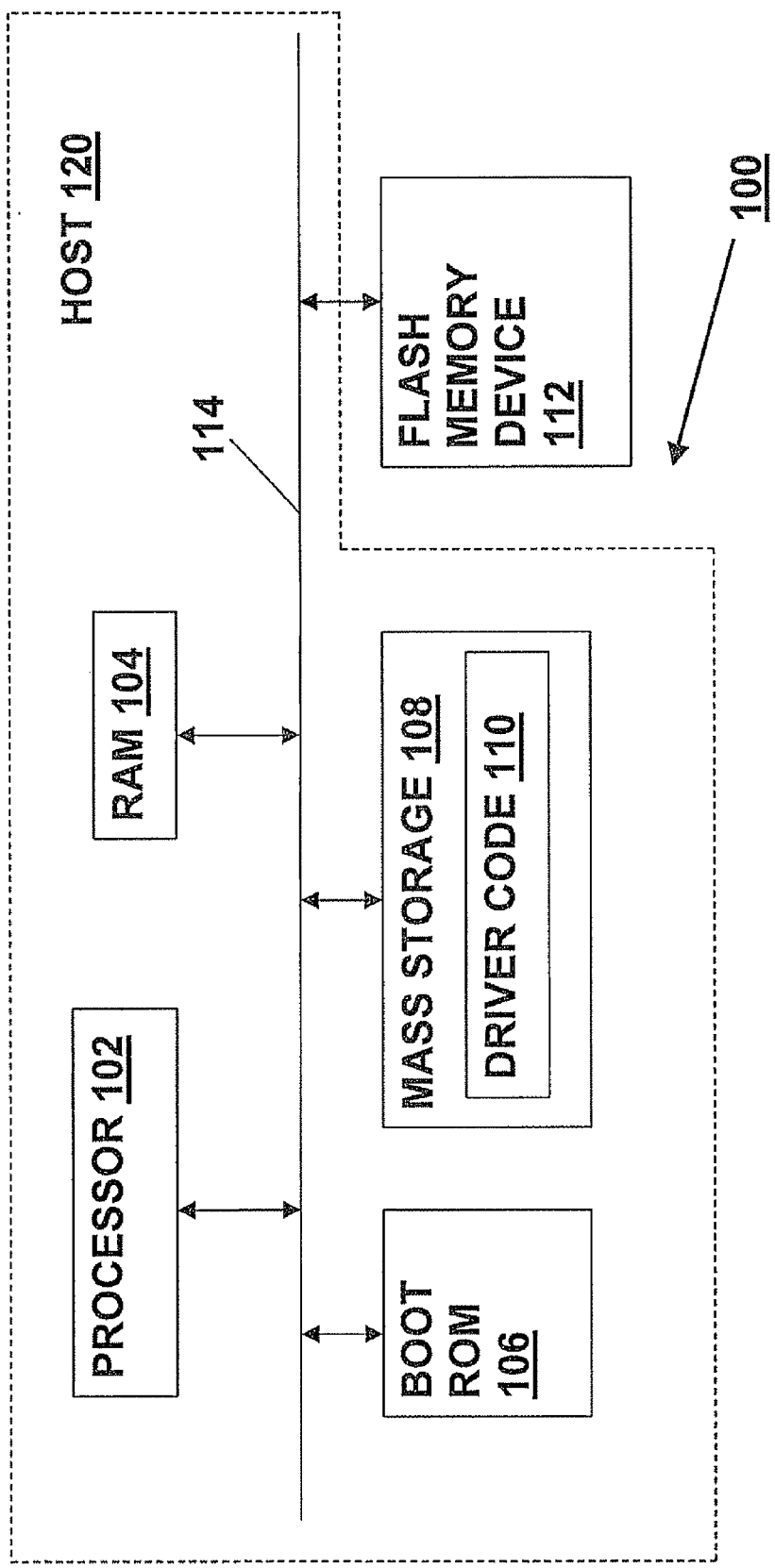
FIG. 7 is a high-level schematic block diagram of a memory system in which most of the functionality of the controller of FIG. 5 is emulated by software.

FIG. 7 is a high-level block diagram of a system 100 in which most of the functionality of controller 20 is effected by software. System 100 includes a processor 102 and four memory devices: a RAM 104, a boot ROM 106, a mass storage device (hard disk) 108 and a modified flash memory device of FIG. 5 as a flash memory device 112, all communicating via a common bus 114. The difference between the flash memory device of FIG. 5 and flash memory device 112 is that the controller of flash memory device 112 functions only as an interface to bus 114; the rest of the functionality of controller 20 of FIG. 5 as described above is emulated by flash memory driver code 110 that is stored in mass storage device 108 and that is executed by processor 102 to interface between user applications executed by processor 102 and flash memory device 112, and to manage the flash memory of flash memory device 112. In addition to the conventional functionality of such flash management driver code, driver code 110 emulates the functionality of controller 20 of FIG. 5 with respect to punctured encoding and decoding of codewords that are stored in memory cell array 1 and that are read from memory cell array 1, as described above. Driver code 110 typically is included in operating system code for system 100 but also could be freestanding code.

The components of system 100 other than flash memory device 112 constitute a host 120 of flash memory device 112. Mass storage device 108 is an example of a computer-readable storage medium bearing computer-readable driver code for efficient punctured decoding as described above. Other examples of such computer-readable storage media include read-only memories such as CDs bearing such code.

Although the methods and the decoders disclosed herein are intended primarily for use in data storage systems, these methods and decoders also are applicable to communications systems, particularly communications systems that rely on wave propagation through noisy transmission media.

Figure 8:
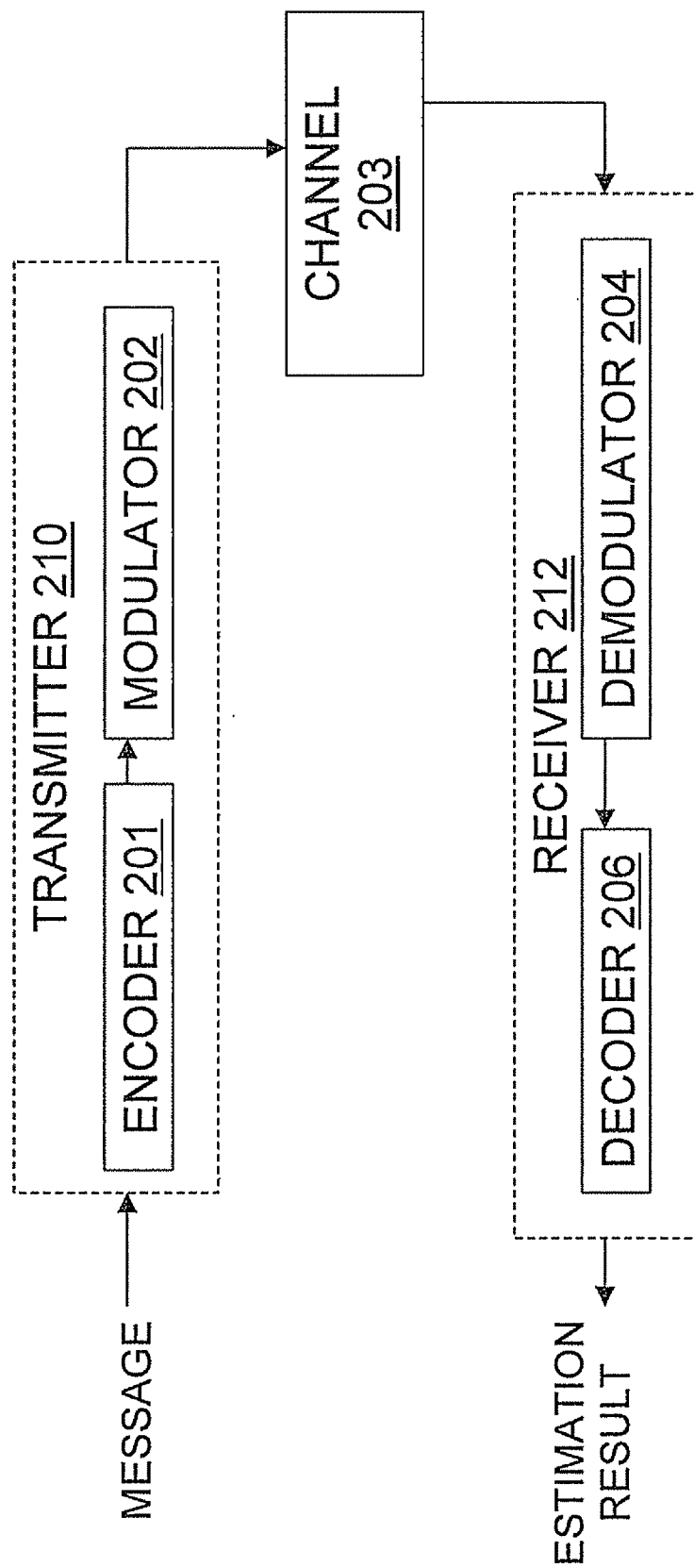
FIG. 8 is a high-level schematic block diagram of a communication system whose receiver includes the decoder of FIG. 3 or the decoder of FIG. 4.

FIG. 8 is a high-level schematic block diagram of a communication system 200 that includes a transmitter 210, a channel 203 and a receiver 212. Transmitter 210 includes an encoder 201 and a modulator 202. Receiver 212 includes a demodulator 204 and decoder 206 that could be, for example, either decoder 60 of FIG. 3 or decoder 80 of FIG. 4. Encoder 201 receives a message and generates a corresponding punctured codeword. Modulator 202 subjects the generated punctured codeword to a digital modulation such as BPSK, QPSK or multi-valued QAM and transmits the resulting modulated signal to receiver 212 via channel 203. At receiver 212, demodulator 204 receives the modulated signal from channel 203 and subjects the received modulated signal to a digital demodulation such as BPSK, QPSK or multi-valued QAM. Decoder 206 decodes the resulting representation of the original punctured codeword as described above.

In one variant of the method described above for efficient decoding of a punctured codeword, H' is derived from H, not by Gaussian elimination, but by merging groups of rows of H. In each group, the number of 1's in each column associated with a punctured bit must be even, so that modulo 2 addition of the rows of the group sums those 1's to a 0.

An important special case is that of merging pairs of rows of H. Clearly, m must be an even number in this special case. The resulting matrix H' has m/2 rows and n−m/2 columns. The parity check matrix of FIG. 2 is an example of a matrix H from which H' can be derived by mergers of pairs of rows. In this case, m' 2 m'. The merging is done by modulo 2 addition of the pair (row 1 and row m'+1), the pair (row 2 and row m'+2), . . . , the pair (row m' and row 2m'). In addition, the matrix H preferably is designed so that the merged rows have their 1's in different columns (except, of course, for the columns associated with punctured bits). This way, if all the rows of H have the same number of 1's, then all the rows of H' also have the same number of 1's. This property is desirable for iterative decoding, as right regular LDPC codes can be designed to achieve a near optimal error correction capability. Moreover, the systematic structure facilitates an efficient decoder hardware design.

In this variant, H and H' can be stored in the same array in non-volatile memory 86 of decoder 80. For each row of H, only the indices of the columns in which the elements of that row are 1's are stored. If H is a regular matrix (a matrix in which all the rows have the same number of 1's), the storage is even simpler because the indices are just stored successively and code reduction module 82 knows that after traversing a predetermined number of indices a new row of H has started. If H is designed so that the merged rows have their 1's in different columns, it is not necessary to store H' separately because H' can be generated on the fly by merging rows of H. The indices of the "1" elements of the merged rows of H also are indices of the "1" elements of the rows of H'.

If H' is derived by merging consecutive rows of H (merging the first and second rows of H, merging the third and fourth rows of H, . . . , merging the m−1-th and m-th rows of H), decoder 80 can implement either unpunctured decoding (of a representation of an n-element unpunctured codeword) using H or punctured decoding (of a representation of a n'-element punctured codeword) using H'.

A second variant of the method described above addresses a potential shortcoming of the method. A full Gaussian elimination, all the way to a matrix H' with m' rows, may produce a matrix H' that is not sufficiently sparse to use in decoding by message passing. Empirically, a useful criterion for sparseness is that the average column degree of H', i.e. the average number of 1's per column of H', should be less than 10 and also less than the number of rows of H' divided by 4. (In good LDPC codes, the average column degrees of the parity check matrices are between 3 and 4.) The Gaussian elimination for deriving H' from H is implemented until eliminating another column of H would produce a matrix H' that is not sparse according to this criterion. Then, during the decoding, conventional erasure decoding is used to handle the punctured bits whose corresponding columns of H have not been eliminated.

One context for a third variant of the method described above is illustrated in FIG. 9 that illustrates the bipartite graph that represents a LDPC code as being divided into several sections in the following way: 1) Divide the set V of bit nodes into t disjoint subsets: $V_1, V_2, \ldots, V_t$ (such that $V=V_1 \cup V_2 \cup \ldots \cup V_t$). 2) For each subset $V_i$ of bit nodes, form a subset $C_i$ of check nodes, including all of the check nodes that are connected solely to the bit nodes in $V_i$. 3) Form a subset $C_J$ of external check nodes, including all of the check nodes that are not in any of the check node subsets formed so far, i.e. $C_J=C\setminus(C_1\cup C_2\cup \ldots \cup C_t)$. 4) Divide the graph G into t sub-graphs $G_1, G_2 \ldots, G_t$ such that $G_i=(V_i, C_i, E_i)$ where $E_i$ is the set of edges connected between bit nodes in $V_i$ and check nodes in $C_i$. Denote the edges connected to the set $C_J$ by $E_J$ (note that $E_J=E\setminus(E_1\cup E_2\cup \ldots \cup E_t)$).

In these embodiments, the graph G is processed according to a special message passing schedule, by iteratively performing decoding phases, and in each decoding phase exchanging messages along the graph edges in the following order:

for i=1 through t

Figure 9:
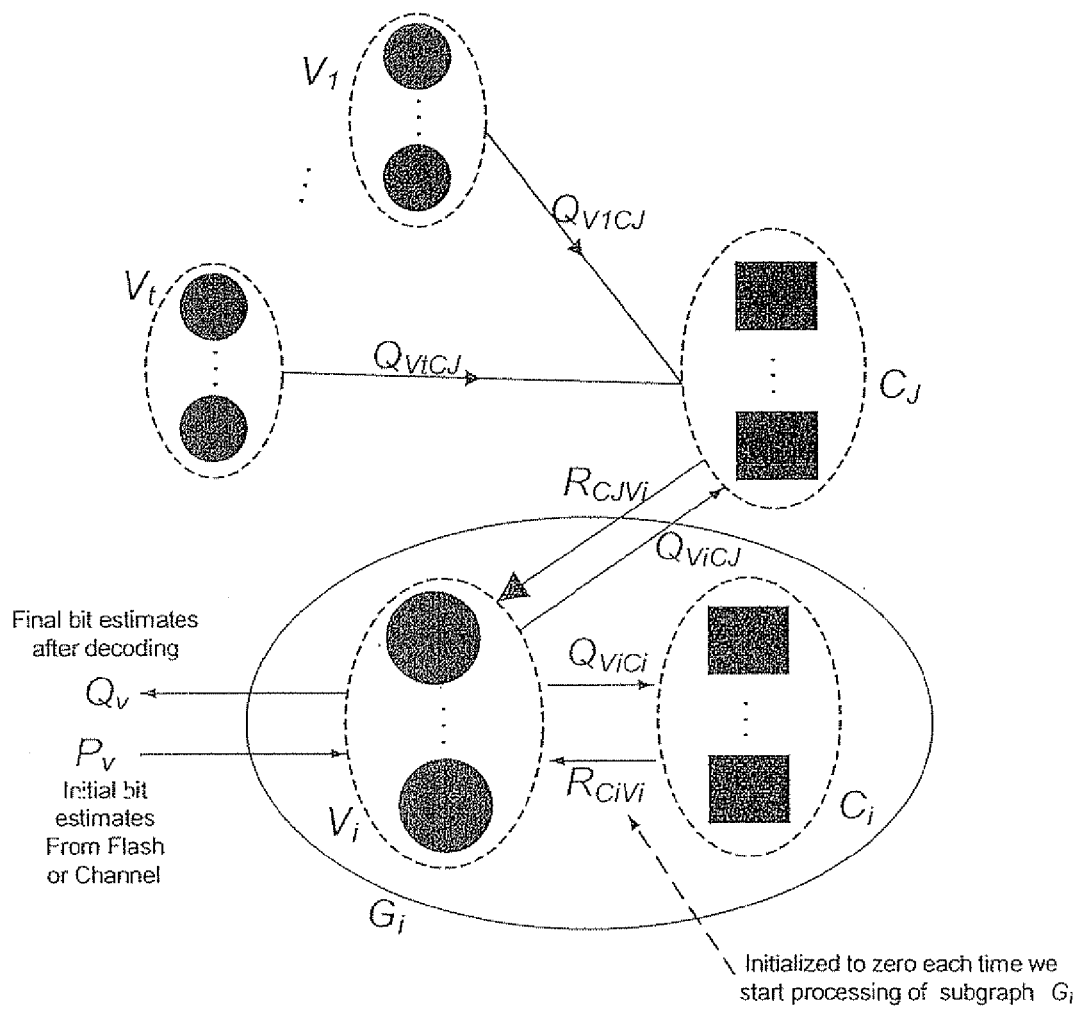
FIG. 9 illustrates the context of a third variant of the method described herein.

1. Send messages from check nodes c∈$C_J$ to bit nodes v∈$V_i$ along edges in $E_J$, depicted as the $R_{c_Jv_i}$ messages in FIG. 9. Set messages from check nodes c∈$C_i$ to bits nodes v∈$V_i$ to zero, depicted by the $Rc_iv_i$ messages in FIG. 9. Set initial bit estimations for every bit v∈$V_i$, depicted as the $P_{v_i}$ messages in FIG. 9. Note that the messages $R_{c_Jv_i}$ are the result of activating the decoder for the other t−1 sub-graphs $G_k$, k≠i, prior to this step. In the event that other sub-graphs have not been processed yet, their corresponding messages $Q_{v_ic_J}$ in FIG. 9 are set to the initial bit estimates as read from the memory or received from the communication channel. Note that the initial (LLR) estimates of punctured bits are identically zero.

2. Perform one or more iterations by sending messages from bit nodes in $V_i$ to check nodes in $C_i$, and messages from check nodes in $C_i$ to bit nodes in $V_i$, along the edges in $E_i$, according to some schedule. This is depicted as the $Qv_ic_i$ and $Rc_iv_i$ messages in FIG. 9.

3. Send messages from bit nodes in $V_i$ to check nodes in $C_J$ along the edges in $E_J$, depicted as the $Qv_ic_J$ messages in FIG. 9.

Decoding continues until the decoder converges to a valid codeword, satisfying all the parity-check constraints, or until a maximum number of allowed decoding phases is reached. The stopping criterion for the message passing within each sub-graph i is similar: iterate until either all the parity-check constraints within this sub-graph are satisfied or a maximum number of allowed iterations is reached. In general, the maximum allowed number of iterations may change from one sub-graph to another or from one activation of the decoder to another.

Figure 10:
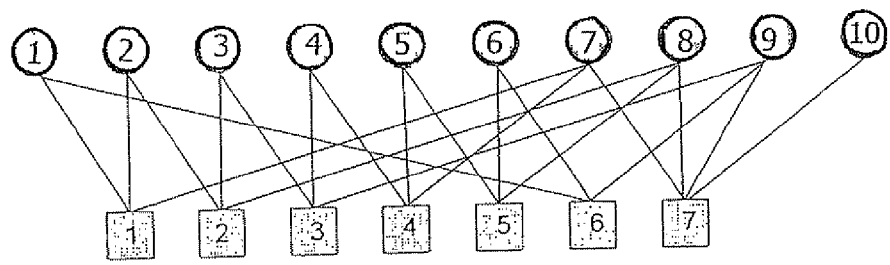
FIG. 10 shows a Tanner graph for illustrating the transformation of H to H' according to the third variant of the method described herein.

In some implementations of this context, the check nodes in $C_J$ are connected only to bit nodes corresponding to the punctured bits. The message exchange within the isolated sub-graphs $G_i$ is performed using a matrix H' that ignores not only the punctured bits but also the bits that are connected by H only to punctured bits. FIG. 10 shows a Tanner graph that illustrates how such an H' is derived from such an H. The numbered circles are bit nodes. The numbered squares are check nodes. Note that the Tanner graph of FIG. 10 is only for illustrating the concept of the third variant and is not necessarily a Tanner graph that would be useful in the context of FIG. 9. The matrix H that corresponds to the Tanner graph of FIG. 10 is:

$$H = \begin{pmatrix} 1 & 1 & 0 & 0 & 0 & 0 & 1 & 0 & 0 & 0 \\ 0 & 1 & 1 & 0 & 0 & 0 & 0 & 1 & 0 & 0 \\ 0 & 0 & 1 & 1 & 0 & 0 & 0 & 0 & 1 & 0 \\ 0 & 0 & 0 & 1 & 1 & 0 & 1 & 0 & 0 & 0 \\ 0 & 0 & 0 & 0 & 1 & 1 & 0 & 1 & 0 & 0 \\ 1 & 0 & 0 & 0 & 0 & 1 & 0 & 0 & 1 & 0 \\ 0 & 0 & 0 & 0 & 0 & 0 & 1 & 1 & 1 & 1 \end{pmatrix} \quad (4)$$

Bits 7, 8 and 9 are punctured. H' is derived by modulo-2 addition of rows 1 and 4, rows 2 and 5, and rows 3 and 6, followed by omission of the last row and the last four columns. Hence:

$$H' = \begin{pmatrix} 1 & 1 & 0 & 1 & 1 & 0 \\ 0 & 1 & 1 & 0 & 1 & 1 \\ 1 & 0 & 1 & 1 & 0 & 1 \end{pmatrix} \quad (5)$$

A limited number of embodiments of methods for punctured decoding, and of devices and systems that use the methods, have been described. It will be appreciated that many variations, modifications and other applications of the methods, devices and system may be made.

What is claimed is:

1. A method of porting k input bits, comprising:
   (a) encoding the input bits according to a first code with which is associated a parity check matrix H that has m rows and n=m+k columns, thereby producing a codeword of n bits;
   (b) puncturing the codeword, thereby providing a punctured codeword of n'<n bits;
   (c) exporting the punctured codeword to a corrupting medium;
   (d) importing a representation of the punctured codeword from the corrupting medium;
   (e) deriving a matrix H' from H by merging pairs of rows in H, wherein the pairs of rows have one's in different columns; and
   (f) decoding the representation of the punctured codeword using the matrix H' that has fewer than m'=m−(n−n') rows and fewer than n' columns.

2. The method of claim 1, wherein the first code is a block code.

3. The method of claim 1, wherein the puncturing includes eliminating n−n' selected bits from the codeword, and wherein the deriving of H' from H is effected by steps including performing Gaussian elimination on H to set equal to zero elements 1 through m' of the columns of H that correspond to the selected bits, thereby producing a matrix H'', H' then being selected rows of H'' without the columns that correspond to the selected bits and without at least one column that corresponds to another bit that is connected, by H, only to the selected bits and wherein the Gaussian elimination is terminated when further Gaussian elimination would produce a matrix H' that fails to satisfy a predetermined criterion of sparseness.

4. The method of claim 1, wherein the decoding includes exchanging messages between the rows of H' and the columns of H'.

5. The method of claim 1, wherein the corrupting medium is a transmission medium, wherein the exporting includes transmitting the punctured codeword via the transmission medium, and wherein the importing includes receiving the representation of the punctured codeword from the transmission medium.

6. The method of claim 1, wherein the corrupting medium is a storage medium, wherein the exporting includes storing the punctured codeword in the storage medium, and wherein the importing includes reading the representation of the punctured codeword from the storage medium.

7. A memory device comprising:
   (a) a memory, and
   (b) a controller for storing k input bits in the memory and for recovering the input bits from the memory, the controller including:
      (i) an encoder for:
         (A) encoding the input bits according to a code with which is associated a parity check matrix H that has m rows and n=m+k columns, thereby producing a codeword of n bits,
         (B) puncturing the codeword, thereby providing a punctured codeword of fewer than n bits, and
      (ii) a decoder for decoding a representation of the punctured codeword that has been read from the memory, the decoding being effected using a matrix H' that has fewer than m'=m−(n−n') rows and fewer than n' columns, wherein the matrix H' is derived from H by merging pairs of rows in H and the pairs of rows have one's in different columns and wherein H and H' are stored in a same array within the memory.

8. A system comprising:
   (a) a first memory; and
   (b) a host of the first memory including:
      (i) a second memory having stored therein code for managing the first memory by steps including:
         (A) encoding k input bits according to a code with which is associated a parity check matrix H that has m rows and n=m+k columns, thereby producing a codeword of n bits,
         (B) puncturing the codeword, thereby providing a punctured codeword of n'<n bits,
         (C) storing the punctured codeword in the first memory,
         (D) reading a representation of the punctured codeword from the first memory,
         (E) deriving a matrix H' from H by merging pairs of rows in H, wherein the pairs of rows have one's in different columns, and
         (F) decoding the representation of the punctured codeword using the matrix H' that has fewer than m'=m−(n−n') rows and fewer than n' columns, and
      (ii) a processor for executing the code.

9. A computer-readable storage medium having embodied thereon computer-readable code for managing a memory, the computer-readable code comprising:
   (a) program code for encoding k input bits according to a code with which is associated a parity check matrix H that has m rows and n=m+k columns, thereby producing a codeword of n bits;
   (b) program code for puncturing the codeword, thereby providing a punctured codeword of n'<n bits;
   (c) program code for storing the punctured codeword in a memory;
   (d) program code for reading a representation of the punctured codeword from the memory;

(e) program code for deriving a matrix H' from H by merging pairs of rows in H, wherein the pairs of rows have one's in different columns; and (f) program code for decoding the representation of the punctured codeword using the matrix H' that has fewer than m'=m−(n−n') rows and fewer than n' columns.

10. A communication system comprising:
(a) a transmitter including:
   (i) an encoder for:
      (A) encoding k input bits according to a code with which is associated a parity check matrix H that has m rows and n=m+k columns, thereby producing a codeword of n bits, and
      (B) puncturing the codeword, thereby providing a punctured codeword of fewer than n bits, and
   (ii) a modulator for transmitting the punctured codeword via a communication channel as a modulated signal; and
(b) a receiver including:
   (i) a demodulator for receiving the modulated signal from the communication channel and for demodulating the modulated signal, thereby providing a representation of the punctured codeword, and
   a decoder for decoding the representation of the punctured codeword using a matrix H' that has fewer than m'=m−(n−n') rows and fewer than n columns, wherein the matrix H' is derived from H by merging pairs of rows in H and wherein the pairs of rows have one's in different columns.

11. A method of recovering k input bits that have been encoded as a codeword of n bits according to a first code with which is associated a parity check matrix H that has m rows and n=m+k columns and that have been exported to a corrupting medium as a punctured codeword produced by eliminating n−n' selected bits from the codeword, the method comprising:
(a) importing a representation of the punctured codeword from the corrupting medium;
(b) deriving a matrix H' from H by merging pairs of rows in H, wherein the pairs of rows have one's in different columns; and
(c) decoding the representation of the punctured codeword using the matrix H' that has fewer than m'=m−(n−n') rows and fewer than n' columns.

12. The method of claim 11, wherein the first code is a block code.

13. The method of claim 11, wherein the deriving H' from H is effected by steps including performing Gaussian elimination on H to set equal to zero elements 1 through m' of the columns of H that correspond to the selected bits, thereby producing a matrix H", H' then being selected rows of H" without the columns that correspond to the selected bits and without at least one column that corresponds to another bit that is connected, by H, only to the selected bits and wherein the Gaussian elimination is terminated when further Gaussian elimination would produce a matrix H' that fails to satisfy a predetermined criterion of sparseness.

14. The method of claim 11, wherein the decoding includes exchanging messages between the rows of H' and the columns of H'.

15. A decoder for decoding a representation of a punctured codeword, the punctured codeword having been produced by eliminating n−n' selected bits from a codeword of n bits, the codeword having been produced by encoding k input bits according to a code with which is associated a parity check matrix H that has m rows and n=m+k columns, the decoder comprising:
(a) a code reduction module for deriving a matrix H' from H by merging pairs of rows in H, wherein the pairs of rows have one's in different columns; and
(b) a decoding module for decoding the representation of the punctured codeword using the matrix H' that has fewer than m'=m−(n−n') rows and fewer than n' columns.

16. A receiver comprising:
(a) a demodulator for receiving a modulated signal from a communication channel and for demodulating the modulated signal to provide a representation of a punctured codeword that had been produced by eliminating n−n' selected bits from a codeword of n bits, the codeword having been produced by encoding k input bits according to a code with which is associated a parity check matrix H that has m rows and n=m+k columns; and
(b) a code reduction module for deriving a matrix H' from H by merging pairs of rows in H, wherein the pairs of rows have one's in different columns; and
(c) a decoding module for decoding the representation of the punctured codeword using the matrix H' that has fewer than m'=m−(n−n') rows and fewer than n' columns.

* * * * *